United States Patent
Zhu

[19]

[11] Patent Number: 5,849,610
[45] Date of Patent: Dec. 15, 1998

[54] METHOD FOR CONSTRUCTING A PLANAR EQUAL PATH LENGTH CLOCK TREE

[75] Inventor: Qing Zhu, Fremont, Calif.

[73] Assignee: Intel Corporation, Santa Clara, Calif.

[21] Appl. No.: 622,706

[22] Filed: Mar. 26, 1996

[51] Int. Cl.$^6$ .................................................. H01L 27/10
[52] U.S. Cl. ...................... 438/129; 257/208; 327/293; 364/491; 395/552
[58] Field of Search ........................... 257/208; 438/129; 327/291–297; 364/491; 395/551–552

[56] References Cited

U.S. PATENT DOCUMENTS

| | | | |
|---|---|---|---|
| 5,519,351 | 5/1996 | Matsumoto | 327/295 |
| 5,557,779 | 9/1996 | Minami | 395/500 |
| 5,691,662 | 11/1997 | Soboleski et al. | 327/292 |

OTHER PUBLICATIONS

Qing Zhu; "Planar Clock Routing for Chip and Package Co–Design", IEEE Transactions on VLS1 Systems, Jun. 1996, pp. 0–33.

Primary Examiner—Sara W. Crane
Attorney, Agent, or Firm—Blakely, Sokoloff, Taylor & Zafman LLP

[57] ABSTRACT

A method of constructing a planar equal path length clock tree. Prior computer-generated methods of creating low-skew clock trees required that clock sinks be uniformly distributed throughout the circuit. Moreover, the tree produced would often be non-planar, thus increasing layout design complexity and cost. The present invention provides for a method of automatically producing a planar clock tree with equal path lengths from each clock sink to the clock source. A first branch wire is formed between the clock source and the clock sink that is a farthest distance from the clock source. Thereafter, the remaining uncoupled clock sinks are coupled to the clock tree according to a maximum rule and a minimum rule. Thus a planar equal path length clock tree is formed. The planar equal path length clock tree is transformed in to a rectilinear clock tree, including horizontal and vertical wires, by using a line search algorithm. The rectilinear clock tree may then be optimized for tolerable clock skew by a cut-and-link method.

28 Claims, 13 Drawing Sheets

METHOD FOR CONSTRUCTING A PLANAR EQUAL PATH LENGTH CLOCK TREE

FIELD OF THE INVENTION

The field of the invention relates to the clocking of integrated circuits. More specifically, the invention relates to a method for constructing a planar equal path length clock tree.

BACKGROUND OF THE INVENTION

Most integrated circuits include a clock network for providing a clock signal to various synchronized circuitry. The clock network typically includes one or more clock sources that are coupled to one or more clock "sinks." A clock sink is any circuit requiring a clock. Examples of sinks include flip-flops, state machines, and counters.

It is typically desired that clocks routed within the integrated circuit be synchronized, such that each clocked device receives the same clock signal at approximately the same time. This ensures that data leaving a clocked source device arrives on time to its clocked destination device.

A phenomenon known as "clock skew," wherein various clock signals arrive at clock sinks at different times, can greatly affect the synchronization. Clock skew is caused by differences in interconnect delays between various clock wires routed through the integrated circuit. The interconnect delay is directly proportional to the following quantities:

$$t_{delay} \propto R_{wire} * (C_{wire} + C_{load})$$

It can therefore be appreciated that in order to minimize clock skew, the resistance (e.g., $R_{wire}$) and capacitance of all of the clock wires (e.g., $C_{wire}$) and the capacitance of all of the clock loads (e.g., $C_{load}$) need to be equalized. Because the wire resistance and capacitance are dependent upon the length of the wire, it is important in routing a clock signal that clock wires lengths are as close to equal as possible. Moreover, it is also important that the load capacitance coupled to each clock wire is equalized as much as possible.

Allowable clock skew is typically a parameter that is set by a designer of a circuit as a percentage of the cycle time of the synchronized components of the system. A typical clock skew may be set at 10% of the cycle time, the cycle time being the inverse of clock frequency. Thus it can be appreciated that as frequencies of integrated circuits, such as high speed microprocessors, increase, the cycle time decreases. The amount of allowable skew therefore becomes smaller.

While reducing clock skew is an important objective in designing high-frequency integrated circuits, there are other parameters that are also taken into consideration during the circuit design process. For instance, as frequencies increase, and high density circuits are developed with an increased number of loads in integrated circuits, the amount of power consumed by the integrated circuit becomes quite large. It is therefore desirable to provide a clock routing technique that not only reduces clock skew, but also decreases an amount of power consumed by the integrated circuit. Moreover, clock rise and fall time is proportional to both line resistance and load capacitance, so it is desirable to reduce the line resistance and load capacitance in designing a low-skew clock tree.

One objective of circuit designers has been to construct a clock tree for connecting clock source to clock destinations, whereby the paths from each clock sink to the clock source are equal. One prior way of reducing clock skew involves routing an equal path length clock tree by manually producing a layout for every clock wire within the integrated circuit. While this method involved a great deal of flexibility in integrated circuit design, such customization is time consuming and costly. Therefore, prior art methods were developed to automatically produce clock networks with computer software.

FIGS. 1a–1c illustrate a variety of prior art clock trees which may be automatically designed (i.e. computer-generated) to minimize clock skew. FIG. 1a is an H-tree clock network. The H-tree couples a clock source 115 to clock sinks (represented as dots), such as clock sink 112. The H-tree in FIG. 1a has one upper level H-shaped tree 110 along with 4 lower level H-shaped subtrees such as subtree 111. As shown, the path from clock source 115 to all of the clock sinks is equal. Therefore the H-tree has the advantage of providing zero skew. The H-tree has one disadvantage, however, in that the clock sinks must be uniformly placed on the integrated circuit in order to facilitate a zero skew H-tree. This is a design constraint that can lead to increased die space, complexity, and engineering time, thus increasing the design cost of the integrated circuit.

FIG. 1b illustrates another prior art clock tree. This clock tree has a thick clock trunk 120 coupled to a clock source 125. Because wire resistance (e.g., $R_{wire}$) is inversely proportional to wire width, the thick clock trunk 120 exhibits a decreased resistance. The delay time for a clock signal to travel on the clock trunk 120 to the clock branches is therefore correspondingly decreased. The clock branches such as clock branch 121 extend to clock sinks 122. Each of clock sinks 122 is not equidistant from the clock source 125.

The design of the clock tree of FIG. 1b is especially well-suited for standard cell designs, in which a standard cell such as cell 123 is repeated many times. An example of a standard cell design is a memory array. The branches 121 extended from the clock trunk 120 are of equal length and equally spaced apart, thus making the clock skew among each of the cells uniform. There are two disadvantages to this type of clock tree system. First, as mentioned above, the path from the source 125 to each clock sink is not equal. Some clock skew will therefore be present. Second, in order for the clock tree to minimize skew, the clock sinks must be spaced in a symmetric fashion, creating design constraints and thereby increasing the cost of design.

The "clock trunk" design of FIG. 1b may alternatively be implemented with more than one clock trunk (i.e. clock trunk 120) strategically placed within the circuit design.

FIG. 1c illustrates a third prior art clock tree. The tree of FIG. 1c is a wire grid structure 130 coupled to a clock source 135. Each clock sink 132 is then coupled to one wire of the clock grid. This arrangement has the advantage of not requiring that clock sinks be symmetrically placed within the circuit layout. However, this design is disadvantageous in that does not provide for an equal path length between the source and clock sinks. Therefore, the clock tree has skew problems.

Other prior art clock trees are designed with equal path lengths, but are not "planar." In other words, in these clock trees, two wires may cross in order to ensure an equal path length. The problem with a non-planar clock tree is that the two wires that cross over each other must be routed in different layers of the integrated circuit. Thus, a large interconnect delay will be encountered by a clock signal traveling through a contact or via to a different metal layer. Non-planar clock trees are therefore undesirable because they exhibit clock skew, despite the fact that the clock tree employs equal path lengths.

What is desired, therefore, is a method of creating a planar clock tree that includes equal path lengths. Moreover, it is desired to provide a method of creating a planar, equal path length clock tree for an arbitrary, non-uniform clock sink placement. It is further desired to provide a method of creating a planar equal path length clock tree automatically, such as with a computer program.

SUMMARY OF THE INVENTION

A method of constructing a planar equal path length clock tree is described. The clock tree couples a clock source to clock sinks in an integrated circuit. A first branch wire of the clock tree is formed between the clock source and the clock sink that is the farthest distance from the clock source. Then a second branch wire of the clock tree is formed between a second clock sink and its corresponding balance point on the first branch wire.

BRIEF DESCRIPTION OF THE DRAWINGS

The present invention is illustrated by way of example and not limitation in the accompanying figures and in which.

DETAILED DESCRIPTION

A method and apparatus for routing a clock tree through an integrated circuit package is described. In the following description, numerous specific details are set forth, such as specific system components, circuitry, materials, and algorithms in order to provide a thorough understanding of the present invention. It will be apparent, however, to one skilled in the art that these specific details need not be employed to practice the present invention. In other instances, well known components or methods have not been described in detail in order to avoid obscuring the present invention.

The present invention provides for constructing a planar clock tree with equal path lengths to each clock sink for use in an integrated circuit. The present invention is advantageous in that clock sinks may be arbitrarily located throughout the integrated circuit design with a reduced clock skew. As an alternative embodiment, the method of the present invention is used to construct a planar clock tree with skew-bounded path lengths, rather than equal path lengths.

The present invention provides a clock tree that is partitioned into a global clock subtree and a set of local clock subtrees. For an embodiment of the invention, the global clock subtree is routed through a package layer of a flip-chip integrated circuit package, while the local subtrees are routed on a device layer within the integrated circuit. Alternately, the global clock subtree may be routed in a package layer of another well-known integrated circuit package, for example, but not limited to, a pin grid array (PGA), dual inline package (DIP), or plastic quad flat pack (PQFP).

In coupling a plurality of uncoupled clock sinks to a clock source, the present invention includes two general steps. First it is determined which branch wire of the clock tree a clock sink will be coupled to. This step is performed in accordance with a "minimum rule." Then a "maximum rule" is used to determine which clock sink is to be coupled to the branch wire next. Both the minimum rule and the maximum rule will be discussed in detail herein below.

FIG. 2 illustrates creating a clock topology according to the present invention. Initially, a source 210 and a plurality of uncoupled clock sinks 212 are provided. Using the given source 210 and sinks 212, it is then determined which of the sinks 212 is the farthest distance from the source. In one embodiment, the distance between the source 210 and each sink 212 is determined according to the "Manhattan" distance. Assuming the source is at point $(x_1, y_1)$ and the sink is at point $(x_2, y_2)$, the Manhattan distance $(d_m)$ is $$d_m = |x_2 - x_1| + |y_2 - y_1|$$

In an alternative embodiment, the distance may be determined according to the "Euclidean" distance. The Euclidean distance $(d_E)$ is represented as $$d_E = \sqrt{(x_2 - x_1)^2 + (y_2 - y_1)^2}$$

Figure 1A:
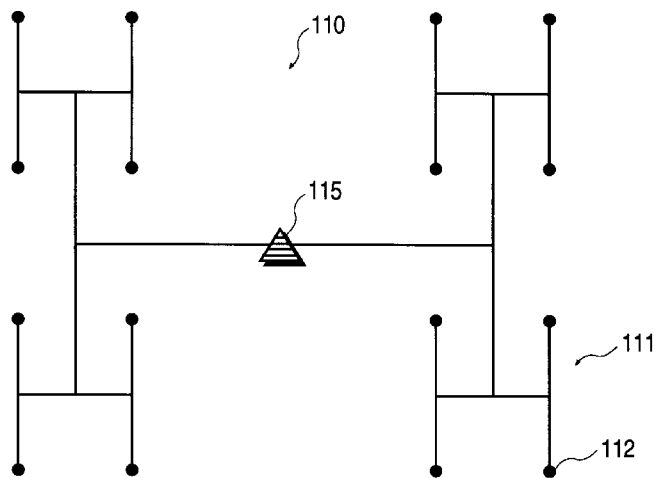
FIG. 1a illustrates a first prior art clock tree.
Figure 1B:
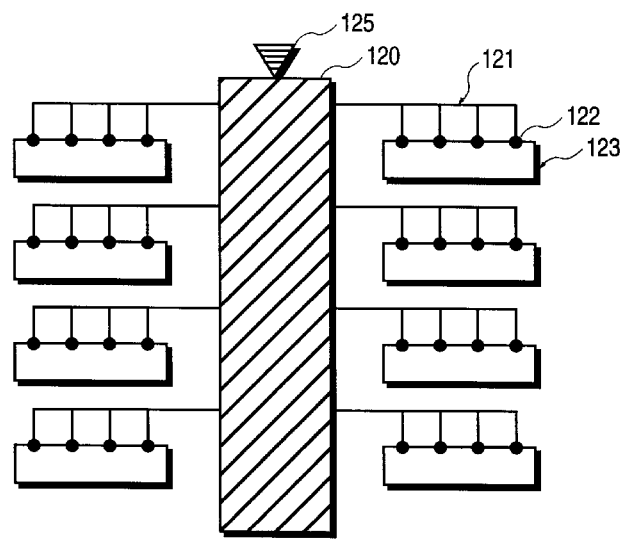
FIG. 1b illustrates second prior art clock tree.
Figure 1C:
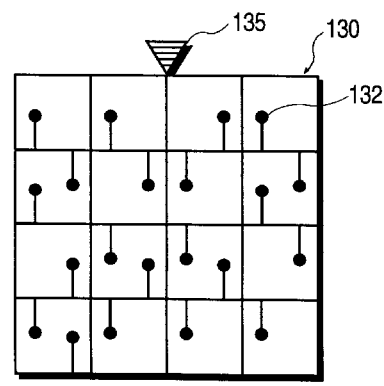
FIG. 1c illustrates a third prior art clock tree.
Figure 2A:
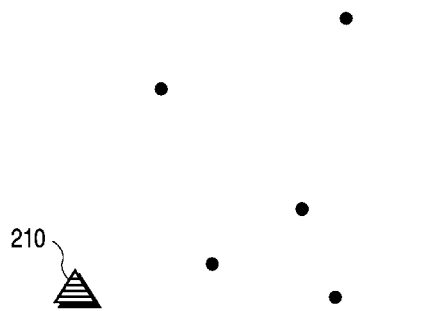
FIG. 2a illustrates a first step in creating a clock topology in accordance with the present invention.
Figure 2B:
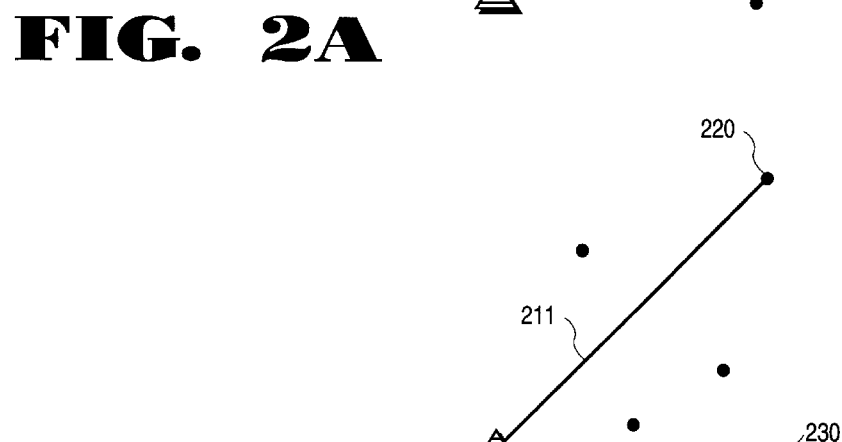
FIG. 2b illustrates a second step in creating a clock topology in accordance with the present invention.

The sink that is determined to be the farthest distance from the source is coupled to the source by a straight line, designating a first clock branch. FIG. 2b illustrates that clock sink 220 is coupled to clock source 210 by clock branch 211. Clock sink 220 is then designated as a "coupled" sink, and the remaining sinks are considered "uncoupled."

Once the first clock branch 211 is formed, the minimum rule is applied to each of the uncoupled clock sinks. This involves the task of finding a "minimal balance distance" for every uncoupled sink. Before discussing the concept of a minimal balance distance, the method of determining a (non-minimal) balance distance for sink 230 will be described.

Figure 2C:
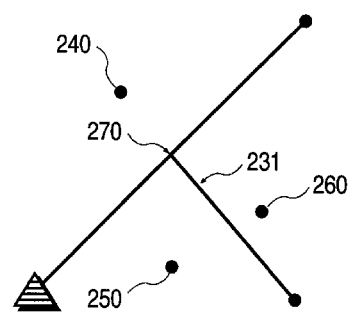
FIG. 2c illustrates a third step in creating a clock topology in accordance with the present invention.
Figure 2D:
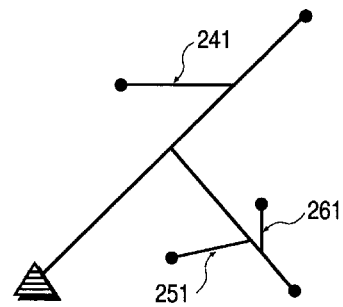
FIG. 2d illustrates a fourth step in creating a clock topology in accordance with the present invention

The balance distance is defined as the distance from sink 230 to its balance point. The balance point is a point on the clock branch 211, picked such that a distance from the balance point to the source 210 will be equal to the distance from the point to the sink 230. Thus, as is illustrated in FIG. 2c, the balance point for sink 230 is point 270 on branch 211. The balance point need not reside on the original branch 211; rather, it may reside on any branch that has already been formed. For instance, once two branches 211 and 231 have been formed, the balance point for other sinks, such as sinks 240, 250, and 260, may reside either on branch 211 or branch 231.

For one embodiment, the balance point (x,y) is found as follows. Assume the free sink is at $(x_0, y_0)$, and the branch the sink is to be coupled to has $(x_1, y_1)$ and $(x_2, y_2)$ as endpoints. Because the Manhattan distance from (x,y) to $(x_0, y_0)$ and $(x_1, y_1)$ is equal, it may be expressed as:

$$|x-x_0|+|y-y_0|=|x-x_1|+|y-y_1|$$

Furthermore, point (x,y) satisfies the equation of a line between $(x_1, y_1)$ and $(x_2, y_2)$, which is represented by:

$$\frac{(y-y_1)}{(x-x_1)} = \frac{(y_2-y_1)}{(x_2-x_1)}$$

These two linear equations are then solved to get the balance point (x, y).

Figure 3A:
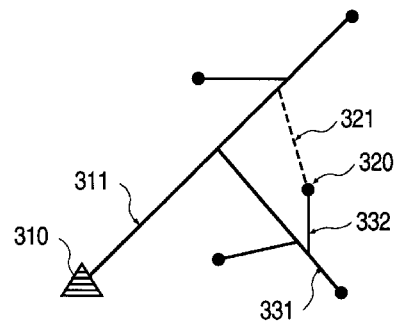
FIG. 3a illustrates the minimum rule employed in accordance with the present invention.

The minimal balance distance is defined by finding the balance point on one of the branches that is the shortest distance from the sink. For instance, FIG. 3a shows a clock tree, wherein sink 320 has two balance points. The first balance point resides on branch 311 and results in branch 321, shown as a dashed line. The second balance point resides on branch 331 and results in branch 322, shown as a solid line. Because the latter option results in a minimum balance distance, branch 322, rather than branch 321, is chosen. For one embodiment of the invention, the balance distance is determined according to the formula for Manhattan distance, described above.

Once the minimal balance distance has been found for each uncoupled sink, then it is determined which sink has the largest minimal balance distance. This limitation is referred to as the "maximum rule", stating that the next clock sink to be coupled is the clock sink that is the farthest from its minimal balance point. The maximum rule, combined with the minimum rule described above, ensures that the clock tree maintains its planarity.

Figure 3B:
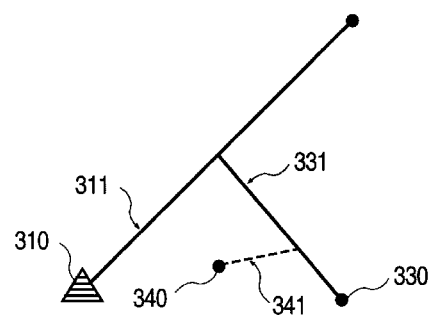
FIG. 3b illustrates the maximum rule employed in accordance with the present invention.
Figure 3C:
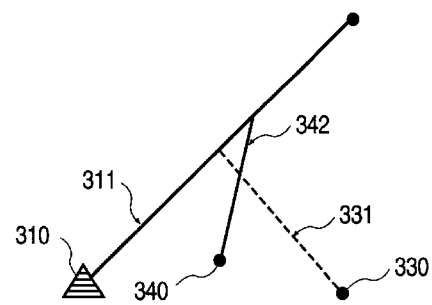
FIG. 3c illustrates the maximum rule employed in accordance with the present invention.

The maximum rule is illustrated in FIGS. 3b and 3c. Starting with clock sinks 330 and 340, one can discern two coupling options. Sink 330 may be coupled to its balance point first, or point 340 may be coupled to its balance point first. FIG. 3b shows the former case wherein the point 330 is first coupled to its balance point, thus forming branch 331. The sink 340 is then coupled to its minimal balance point on branch 331, indicated by the dashed line 340.

The alternate case, wherein sink 340 is coupled before sink 330, is illustrated in FIG. 3c. First sink 340 is coupled to its balance point residing on branch 311. This is illustrated as branch 342. Then sink 330 is coupled to its balance point which is also on branch 311. As shown by the dashed line 331, the branches 331 and 342 would then overlap. The clock tree would not be planar, thus causing the clock skew problems outlined above associated with routing branches 342 and 331 on different layers of the integrated circuit.

Figure 11:
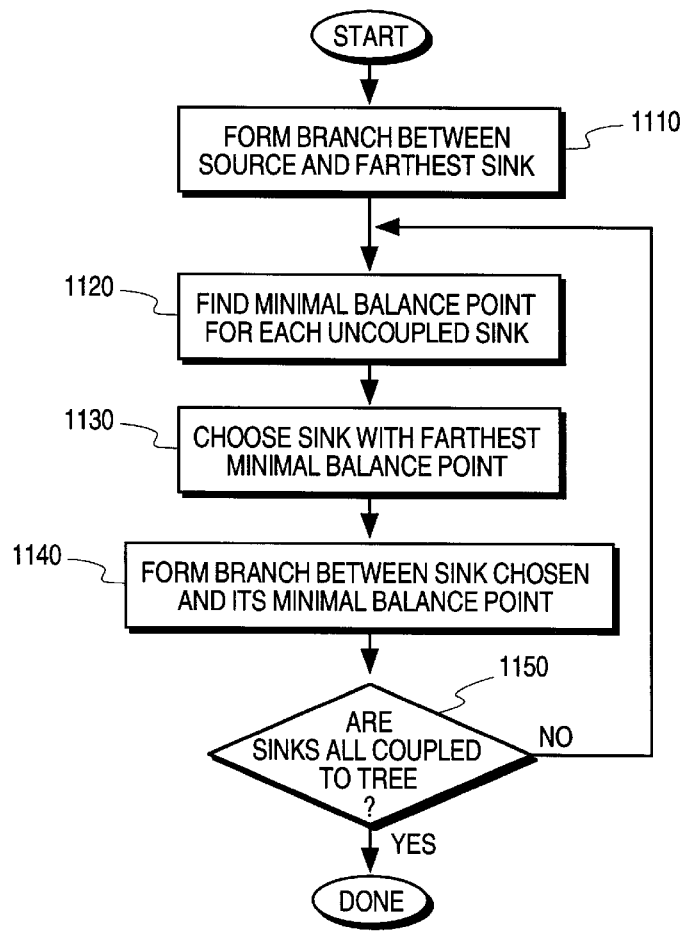
FIG. 11 illustrates a flow chart of one embodiment of a method of creating a clock tree in accordance with the present invention.

The process of forming a planar clock tree can be summarized as follows with reference to FIG. 11. First, step 1110 illustrates that a branch is formed between the clock source and the clock sink that is a farthest distance from the source. At step 1120, the minimal balance point is found for each uncoupled sink (i.e. by applying the minimum rule). Then, at step 1130, the uncoupled sink with the maximum distance from its minimal balance point (i.e. applying the maximum rule) is chosen to be coupled to the clock tree. A branch is formed between the chosen sink and its minimal balance point at step 1140. The chosen sink is thus designated as a coupled clock sink. As illustrated at step 1150, this process is repeated until all uncoupled sinks are coupled to the tree.

Finding the minimal balance point for every uncoupled sink, for every iteration of the above-described process, can be time consuming. Therefore, an alternative embodiment of the invention instead defines "clusters" of clock sinks, wherein each cluster is treated separately for applying the maximum and minimum rules to each cluster.

Figure 4:
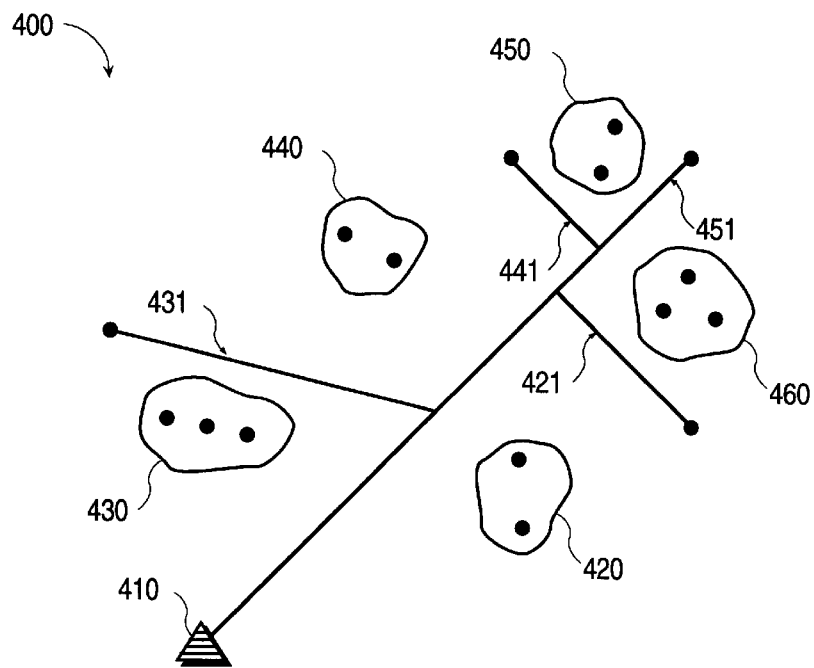
FIG. 4 illustrates clustering of clock sinks in accordance with the present invention.

FIG. 4 shows the clustering method. For each clock branch that is already formed, a set of clock sinks are "bounded" by at least two clock branches. For instance, clock tree 400 comprises branches 421, 431, 441, and 451. Cluster 460 of clock sinks is bounded by branch 451 and branch 421. Cluster 420 is bounded by branches 421 and 451. Once the clusters have been defined, then the maximum and minimum rules are only applied to those clocks sinks within the cluster. Once a new branch is formed according to the maximum and minimum rules, new clusters are defined since the new branch is now a bounding branch.

The following is pseudo code that summarizes the method described above:

```
Input: a source s_0 and a set of sinks D;
Output: a planar equal path length clock tree T.
Procedure PlanarEqualPathLengthClockTree(s_0, D, T) {
    C_0 = D, and insert C_0 into a queue Q;
    for (each sink in D)
        Set s_0 as its minimal balance point;
    T = ({s_0},⊕)
    while (Q ≠ ⊕){
        Extract a cluster C_i from Q_i;
        Select t_i* ∈ C_i whose minimal balance distance is maximized;
        Create a branch on T from t_i* to its minimal balance point;
        if (C_i - {t_i*} ≠ ⊕){
            Update the minimal balance point of each free sink
            considering the newly added branch in C_i;
            Divide C_i - {t_i*} to new clusters by the newly added
            branch and insert them into Q;
        }
    }
}
```

As can be appreciated from FIGS. 2–4, the clock tree constructed according to the method above is not rectilinear. The clock tree therefore does not conform to certain design constraints of modern integrated circuit layout. For another embodiment of the invention, the topological layout of the clock tree is transformed into a rectilinear layout, as is described herein below.

Figure 5A:
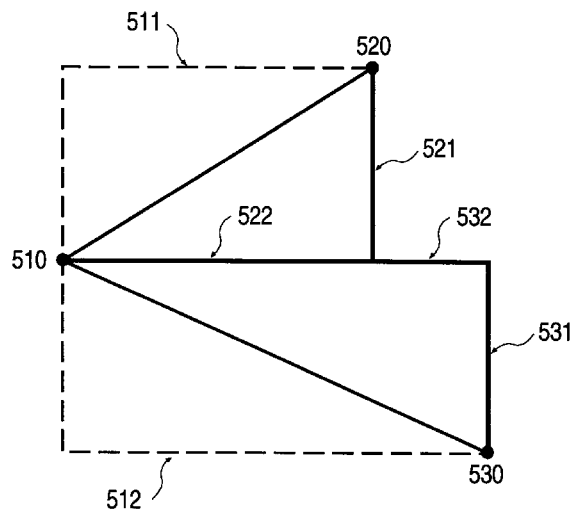
FIG. 5a illustrates a method of creating a rectilinear clock tree in accordance with the present invention.
Figure 5B:
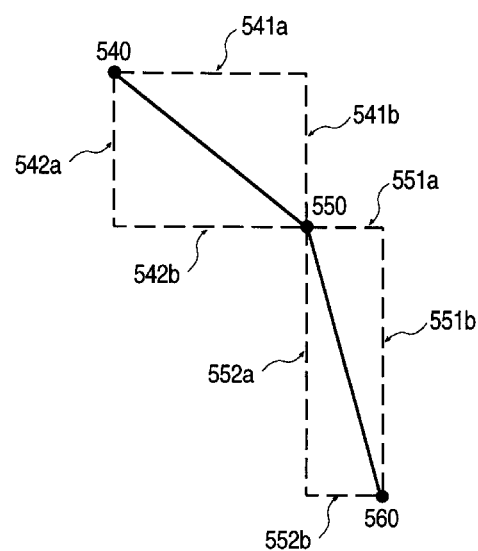
FIG. 5b illustrates a method of creating a rectilinear clock tree in accordance with the present invention.

Referring to FIGS. 5a and 5b, an embodiment of the invention is illustrated in which a topological clock tree is transformed into a rectilinear tree. Each branch of the clock tree is transformed into a set of horizontal and vertical wires. A first step in transforming the clock tree involves creating a "bounding box". A bounding box is a set of horizontal and vertical wires coupling two clock sinks, wherein the box is the smallest rectangle that encompasses both sinks. For instance, in FIG. 5a, the bounding box for sinks 510 and 520 comprises the two sides indicated by dashed lines 511, and the two solid lines 521 and 522. The bounding box for sinks 510 and 530 comprises dashed lines 512 and solid lines 531, 532, and 522.

Note that the two bounding boxes for sinks 510, 520, and 530 have a common side 522. If sinks 510 and 520 and sinks 510 and 530 are coupled along the baseline, the amount of wire required will be minimized. It is therefore advantageous to find all instances where bounding boxes intersect such that the wire routing can be optimized.

Referring now to FIG. 5b, it is apparent that since there is no baseline, either routing along path 541a–b or 542a–b would be equally as efficient to couple sinks 540 and 550. Moreover, either path 551a–b or 552a–b would be desirable to couple sinks 550 and 560.

For one embodiment of the invention, a modified Ohtsuki's line-search algorithm is used to construct the horizontal and vertical wires such that the wires avoid any "obstacles." Obstacles are defined as other rectilinear wires and branches in the vicinity of the sinks being manipulated. The Ohtsuki's line search algorithm is described in *Planar Clock Routing for Chip and Package Co-Design* by Qing Zhu, IEEE Transactions on VLSI Systems, June 1995.

Figure 5C:
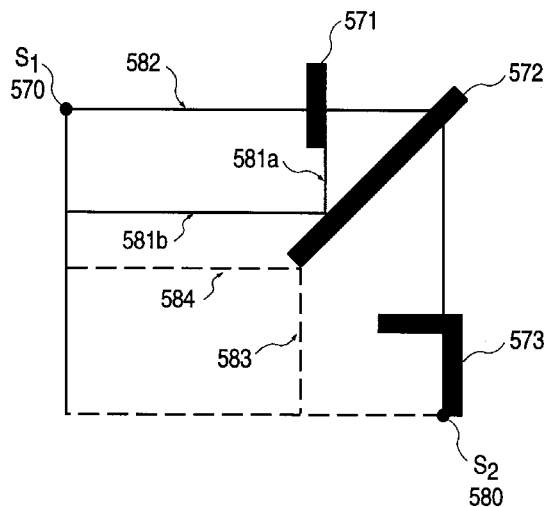
FIG. 5c illustrates a first step in creating a rectilinear clock tree using a line-search algorithm.

Referring to FIG. 5c, the modified Ohtsuki's algorithm is performed as follows. First, a "bounding box" between two sinks (i.e. sink $S_1$570 and sink $S_2$580) is created. The bounding box defines a relevant region in which to search for obstacles.

Thereafter, a set of horizontal and vertical line segments are constructed by extending one horizontal and one vertical line from each corner of each obstacle, until the horizontal or vertical line hits either (1) another obstacle, or (2) the boundary of the region. For instance, horizontal line segment 584 and vertical line segment 583 are constructed from the corner of obstacle 572 to the edges of the bounding box.

If one of the line segments hits an obstacle, then a new line segment is generated from the hit point in a perpendicular direction. For example, line segment 581a "hits" obstacle 572, and thus is continued as segment 581b in a perpendicular direction.

Figure 5D:
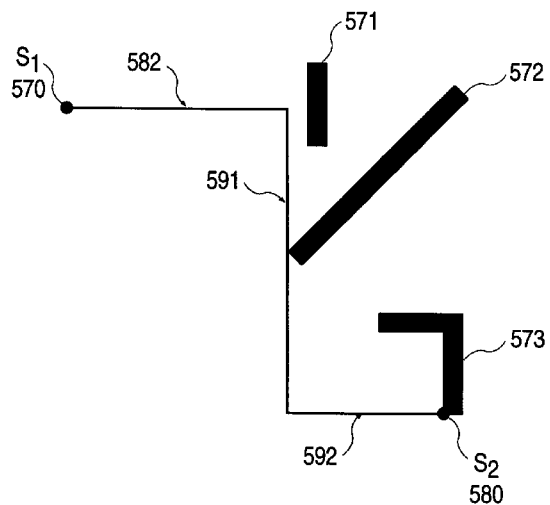
FIG. 5d illustrates a second step in creating a rectilinear clock tree using a line-search algorithm.

FIG. 5d illustrates the next step in the modified Ohtsuki's algorithm. Another line segment is generated incident at clock sink $s_1$, 570. The line is only generated in the direction of the baseline. For instance, assume the base line at sink $s_1$ 570 is in a horizontal direction. Then horizontal line segment 582 is generated.

Next, all of the horizontal and vertical line segments generated as described with reference to FIG. 5c are searched to find only those lines that hit the line 582. The line segment that hits line 582 and is farthest from sink $S_1$ 570 is the line chosen. This takes advantage of the baseline 582. Thus, as is shown in FIG. 5d, the clock tree comprises wires 592, 591, and 582.

The method of creating a rectilinear tree from a topological tree described above is applied to the entire tree topology. For one embodiment, the method is applied to the tree from the "bottom-up." This means that the sinks that are on the outermost branches are transformed first, moving inward towards the trunk until the entire tree comprises rectilinear wires.

Figure 12:
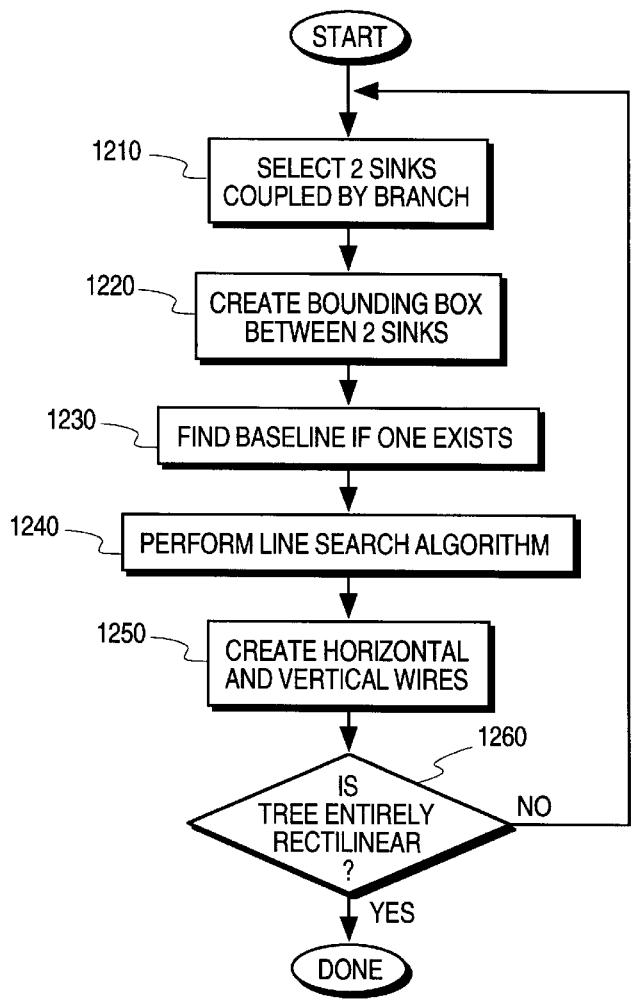
FIG. 12 illustrates a flow chart of one embodiment of a method of creating a rectilinear clock tree in accordance with the present invention.

Thus, the method of creating a rectilinear tree can be summarized as follows, with reference to the flow chart of FIG. 12. First, step 1210 illustrates that two sinks that are coupled by a branch of the clock tree are selected. A bounding box is created between the two selected sinks at step 1220. At step 1230, it is determine whether a baseline exists for the bounding box. The line search algorithm is applied at step 1240 to find a path for horizontal and vertical wires that will avoid any obstacles. The horizontal and vertical wires are then created at step 1250. The steps 1210–1250 are then repeated until the entire tree is rectilinear, comprising horizontal and vertical branch wires.

Once a rectilinear clock tree has been formed, it may be desirable to further reduce the length of the branch wires of the tree. Reducing the length of the branches is advantageous in that it reduces the delay time of the branch.

Figure 6A:
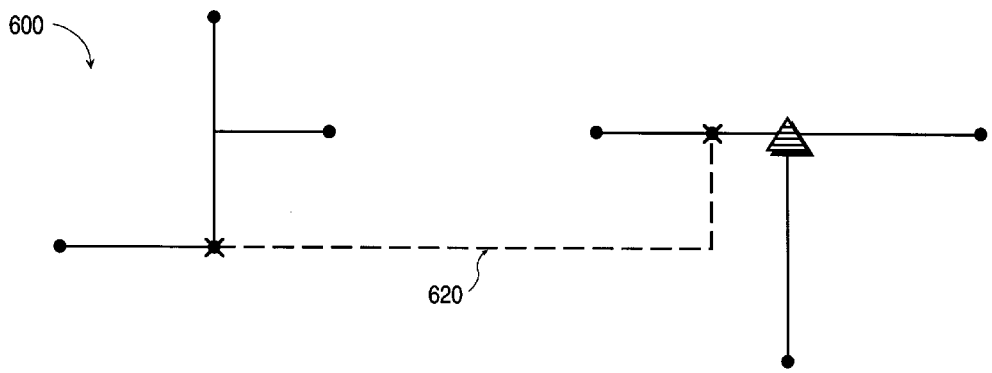
FIG. 6a illustrates a first step in the cut-and-link method of the present invention.
Figure 6B:
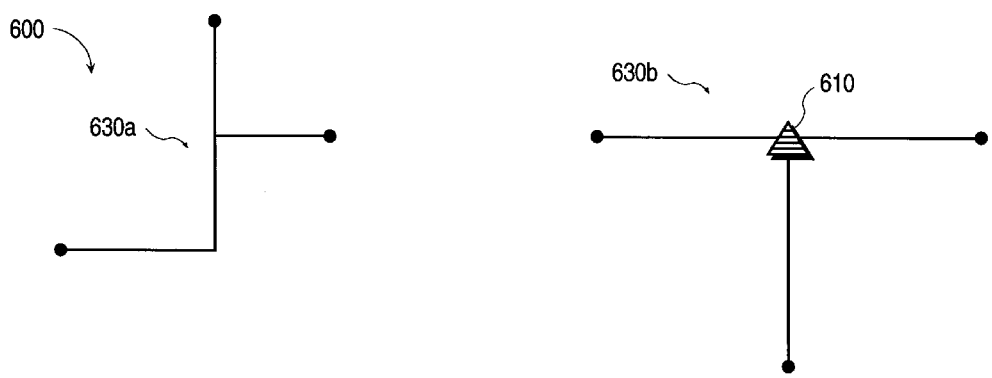
FIG. 6b illustrates a second step in the cut-and-link method of the present invention.
Figure 6C:
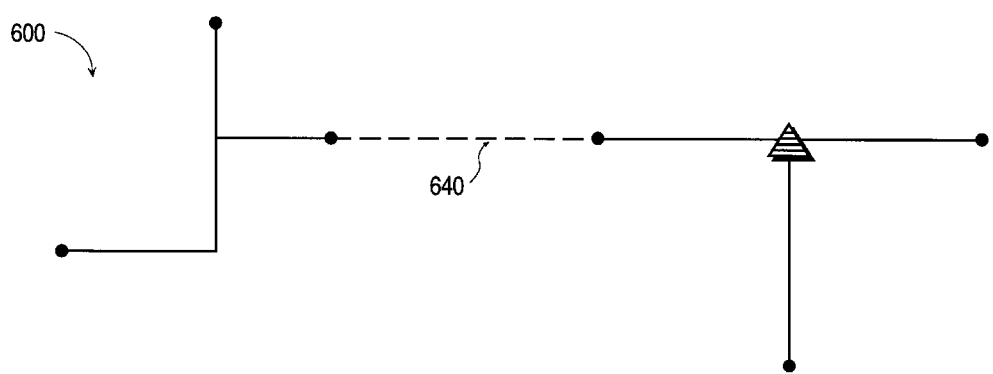
FIG. 6c illustrates a third step in the cut-and-link method of the present invention.

Moreover, although the method as described above allows for zero clock skew, some clock skew may be allowable according to the design constraints. Thus, an embodiment of the invention includes a step of creating a clock tree with skew-bounded minimum branches. FIGS. 6a–c illustrates this method, known as the "cutand-link" method. First, as shown in FIG. 6a, a connection 620 of the tree 600 is "cut," or eliminated from the design. The two remaining subtrees 630a and 630b are then uncoupled (FIG. 6b). The two subtrees 630a and 630b are recoupled with the shortest delay-bounded path, shown as path 640 of FIG. 6c. For one embodiment, the delay bounded path is found by the Elmore delay model. The Elmore delay d(s,t) from a clock source s to sink t in a tree T is provided as follows:

$$d(s,t) = R_d(C_d + C_0) + \sum_{e_i \in \text{path}(s,t)} r_i \left( \frac{c_i}{2} + C_i \right)$$

In the above equation, $R_d$ and $C_d$ are resistance and capacitance of the clock driver at the source; $C_0$ is total capacitance of the clock lines and sinks of tree T; $e_i$ is the line from a node $n_i$ to its "parent" node (i.e. the sink $n_i$ is to be coupled to) of tree T; $r_i$ and $c_i$ are line resistance and capacitance of $e_i$; $C_i$ is total capacitance of lines and sinks in subtree of T rooted at node $n_i$;

In order to determine whether link 640 may be substituted in the clock tree 600 of FIGS. 6a–6c, the delay of link 640 is calculated. It is then determined whether or not link 640 will produce a clock skew within the bounds specified by the system design parameters. If the clock skew is within the desired boundaries, then link 640 is replaced for link 620. The cut-and-link method is then iteratively repeated to links in the tree in order to reduce wire connections within the tree, while still staying within the desired delay parameters.

It should be appreciated that one of many well-known equations, used to determine the delay of the proposed clock link 640, may be used without departing from the scope of the present invention.

Not only is skew an important consideration when designing a clock network, but other considerations must be made as well. For instance, it is important that delay time be minimized. It is further important that load capacitance be distributed fairly evenly, since load capacitance affects delay, which will in turn cause signals to skew. Moreover, clock rise and fall time is proportional to both line resistance and load capacitance, so it is desirable to reduce both of these characteristics. Finally, it is also important for power consumption to reduce load capacitance and line resistance.

The embodiment of the clock tree described herein can be routed on an integrated circuit such that delay time is decreased, skew is decreased, and power consumption is reduced.

One method of decreasing power consumption is by routing the clock lines with larger, thicker wires. This reduces wire resistance and capacitance. However, if the entire clock tree were routed in thick wires, a large amount of area on the integrated circuit would be occupied. This would increase design complexity and costs.

The present invention decreases clock skew, power consumption, and signal rise time by routing part of the clock tree on the integrated circuit and routing the other part of the clock tree through a package layer within the package of the integrated circuit. Typically the wires routed through the package layer are thicker and wider than those on the integrated circuit.

Figure 7:
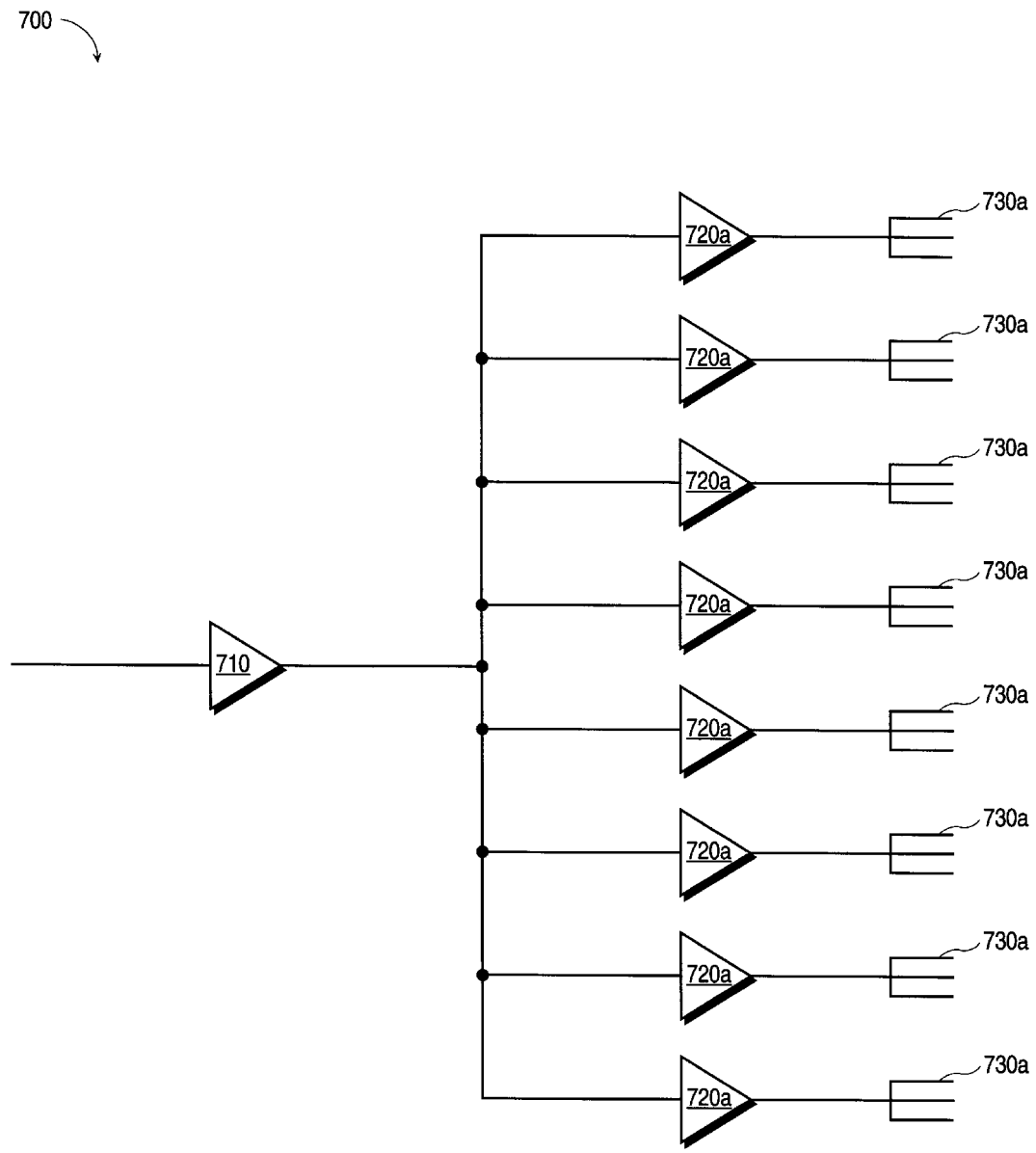
FIG. 7 illustrate split into global and local clock subtrees.

The first step of routing the clock tree is illustrated in FIG. 7. For an embodiment of the invention, the clock tree 700 comprises a planar equal path length clock tree created as described above. For an alternative embodiment, clock tree 700 comprises any clock tree in an integrated circuit.

First, the clock tree 700 is partitioned into clusters, known as local clock trees, i.e. local clock trees 730*a*–730*h*. Each local clock tree 730*a*–730*h* comprises a set of branch wires that couple together a group of clock sinks (not shown). Buffers 720a–720h are inserted to separate local clock trees 730*a*–730*h* from the rest of the tree 700. The part of the tree between the clock source 710 and the first layer of buffers 720*a*–720*h* is designated as the global clock tree.

It should be noted that the clock tree 700 shown in FIG. 7 is symmetric and evenly distributed. It is often the case, however, that a clock tree is not as symmetric as that shown in FIG. 7.

Figure 8:
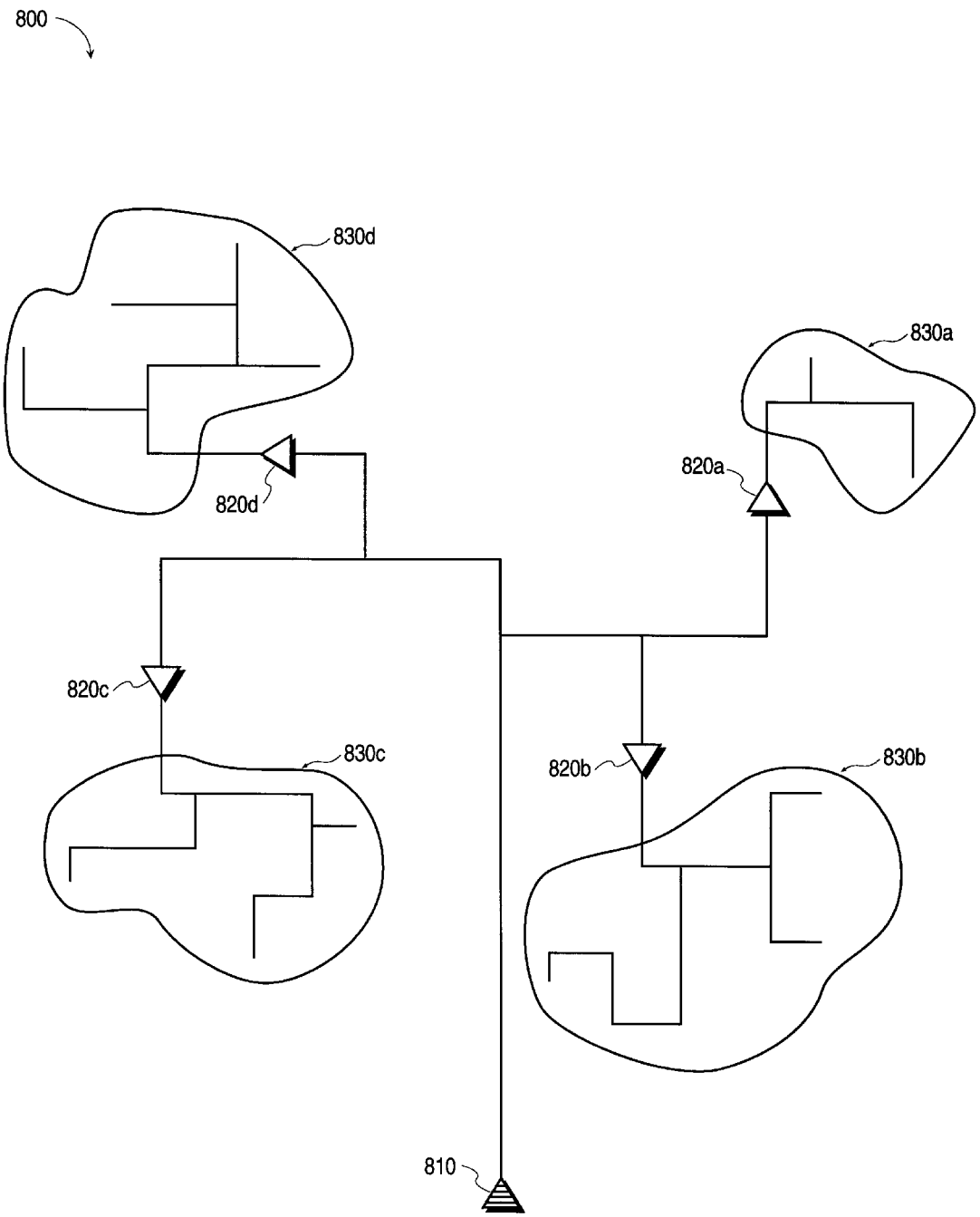
FIG. 8 illustrates clustering of clock sinks to create global and local clock subtrees.

FIG. 8 illustrates a clock tree that is not as evenly distributed. For this type of tree, the first step is to define clusters of clock sinks located within a predefined area, such as clusters 830*a*–830*d*. Buffers 820*a*–820*d* are then inserted to separate the clusters 830*a*–830*d* from the rest of the clock tree 800. The global clock tree defined as the portion of the tree located between buffers 820*a*–820*d* and the clock source 810.

Figure 9:
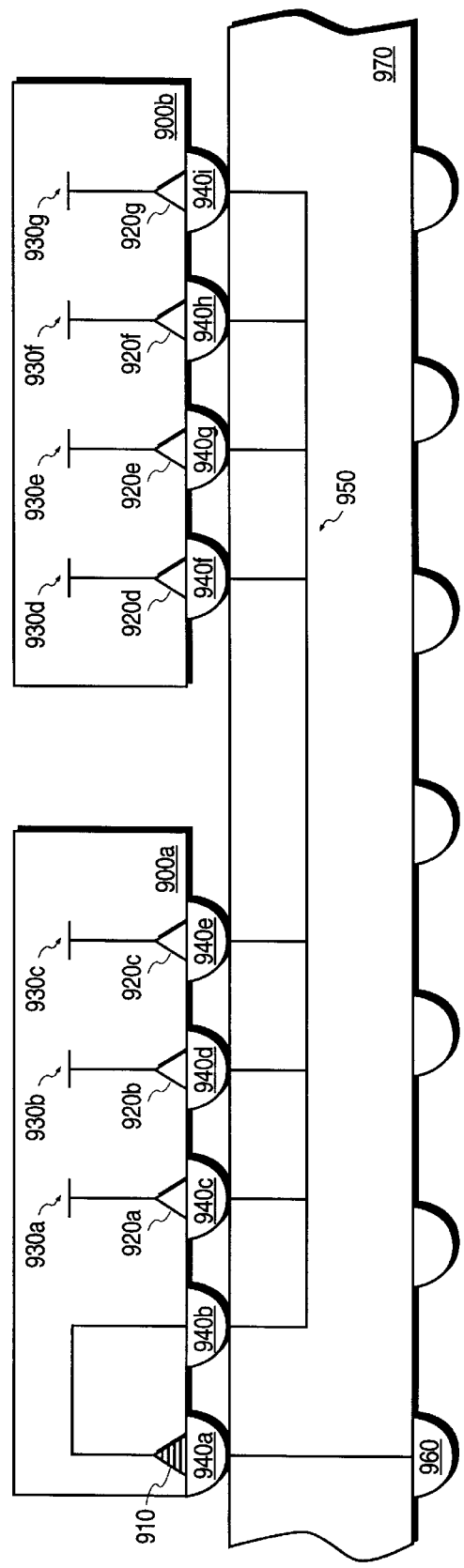
FIG. 9 illustrates a cross-section of a flip-chip integrated circuit package in which a first embodiment of a clock tree of the present invention is implemented.

Once the clock tree has been partitioned into a global clock tree and local clock tree, it is implemented in the integrated circuit according to well-known integrated circuit fabrication and packaging methods. FIG. 9 illustrates one such implementation. FIG. 9 illustrates a cross section of a portion of a multi-chip module (MCM) comprising integrated circuits 900*a* and 900*b*, coupled to a package 970. This configuration shown in FIG. 9 is known as the ball grid array, or "flip-chip," integrated circuit. The package 970 is coupled to the integrated circuits 900*a*–*b* via contacts that are solder bumps 940*a*–*i*. The Input/Output ("I/O") ports are also solder bumps, located on the opposite side of the package, such as solder bump 960. The I/O solder bumps may then soldered directly to a printed circuit board for a system application.

As was discussed above, it is desirable to reduce the wire resistance and capacitance of a clock tree in order to take into consideration power, skew, and rise time parameters. This is accomplished by an embodiment as shown in FIG. 9. The global clock tree 950 is routed in the package 970. Typically the package layer comprises copper, which has lower resistance than the integrated circuit interconnect, usually comprising aluminum or polysilicon. Also, the package layer interconnects are typically wider and thicker than those implemented on the integrated circuits 900*a*–*b*. Thus the resistance of the global clock tree interconnections is decreased. For one embodiment, the resistance of the package layer interconnects is 2–3 orders of magnitude less than that of the integrated circuit layers.

Another advantage of using the package layer is that typically the package layer within package 970 comprises a thick layer of insulator. Thus the capacitance of global clock tree 950 is decreased, decreasing power and rise time.

As is illustrated in the embodiment of FIG. 9, the clock source 910 resides on the integrated circuit 900*a* and is routed to a solder bump 940*b*. The local clock trees 930*a*–*g* and the local clock buffers 920*a*–*g* are routed within integrated circuits 900*a*–900*b* and are coupled to solder bumps 940*a*–*i*. The clock source 910 represents a circuit for generating a clock signal on-chip, such as a phase locked loop (PLL). For this embodiment, the clock source 910 receives an input clock signal from I/O port 960, coupled to an external clock source, such as an oscillator. Another embodiment of the invention includes a clock source 910 that resides entirely off-chip and thus is routed to the local clock trees 930*a*–*g* from I/O port 960. Alternatively, the clock source 910 may reside elsewhere within the integrated circuit package 970. It should be appreciated that the location of the clock source 910 is not intended to limit the scope of the present invention.

There are some additional design and testing considerations to take into account when routing portions of a clock tree on-chip and other portions off-chip. For instance, the local clock trees 930*a*–*g*, coupled to solder bumps 940*a*–*i*, must be electrostatic discharge (ESD) protected according to a well-known ESD protection scheme. Moreover, the testing of integrated circuits 900*a*–*b* will be more difficult in that the clock tree cannot be tested by testing merely integrated circuits 900*a*–*b* alone. It is often the practice in the industry to test integrated circuits for functionality before they are packaged. Thus either new testing methods and testing probe cards must be designed to provide the necessary global clock routing, or the integrated circuits 900*a*–*b* must be packaged before being tested for functionality.

Although the embodiment of FIG. 9 illustrates a ball grid array package, it should be appreciated that other packaging types may be used for the present invention, such as a pin grid array (PGA), dual inline package (DIP), or plastic quad flat pack (PQFP).

Figure 10A:
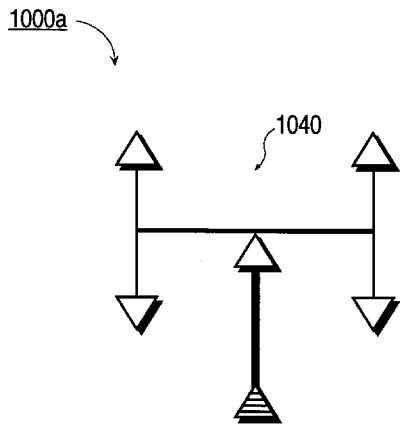
FIG. 10 illustrates how a second embodiment of a clock tree is implemented in an integrated circuit package.
Figure 10B:
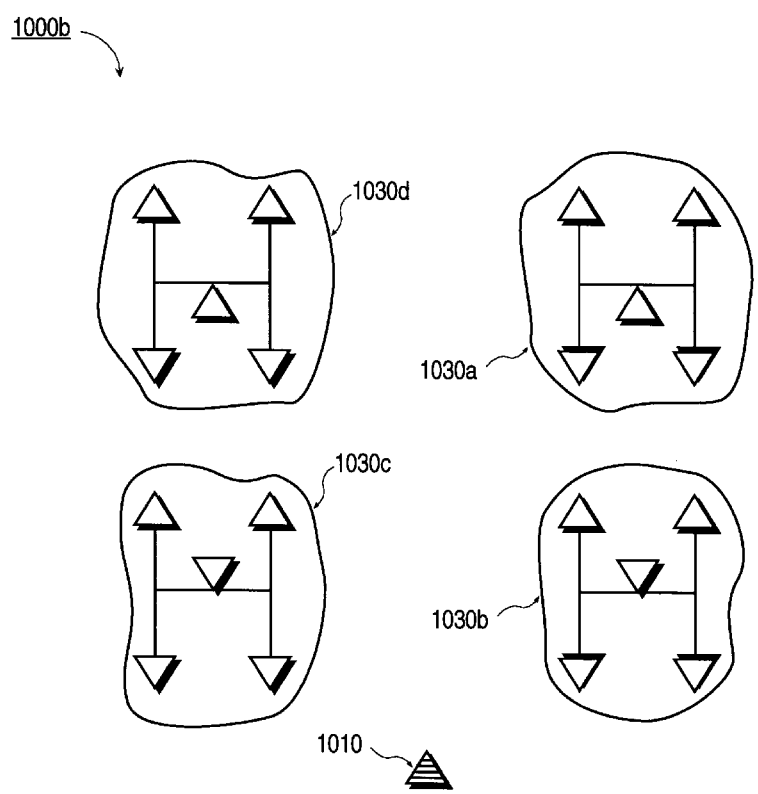

As was discussed previously, any clock tree, not merely a planar equal path length clock tree, may be implemented in both the package and integrated circuit. For instance, FIG. 10 illustrates an H-tree in which the global clock tree 1040 is chosen to be routed within the package layer, and the local clock trees 1030*a*–*d* and the clock source 1010 are routed within the integrated circuit.

In the foregoing detailed description a clock tree, routed in an integrated circuit and package, and method for constructing a planar equal path length clock tree are described. The apparatus and method of the present invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method of automatically constructing a planar equal path length clock tree for coupling two clock sinks to a clock source in an integrated circuit, the method comprising the steps of:

(A) forming a first branch wire on said clock tree between said clock source and a first of said two clock sinks, wherein said first clock sink is a farthest distance from said clock source of said two clock sinks; and (B) forming a second branch wire on said clock tree between said second clock sink and a first balance point on said first branch wire.

2. The method of claim 1, further comprising the step of:

(C) forming a rectilinear clock tree, comprising a set of horizontal and vertical wires, from said planar equal path length clock tree such that said rectilinear clock tree maintains planarity.

3. The method of claim 2, wherein step (C) further comprises the steps of:

(C1) forming a bounding box for said first and second clock sinks;

(C2) determining whether a baseline exists on the bounding box; and (C3) performing a line search algorithm to construct said set of horizontal and vertical wires coupling said first and second clock sinks, wherein said set of wires is within said bounding box, and wherein said set of wires further includes a baseline wire along said baseline, if in step (C2) it is determined that a baseline exists.

4. The method of claim 3, wherein said line search algorithm comprises a modified Ohtsuki's line search algorithm.

5. The method of claim 2, further comprising the steps of:

(D) deleting a first of said set of horizontal and vertical wires of said rectilinear clock tree to create a first clock subtree and second clock subtree; and (E) creating a new branch wire by reconnecting said first clock subtree and said second clock subtree, wherein said new branch wire is a length that is operable to produce a predetermined tolerable clock skew.

6. The method of claim 5, wherein said new branch wire is formed along a shortest path between said first and second clock subtrees, and wherein said shortest path is operable to produce said predetermined tolerable clock skew.

7. A method of automatically constructing a clock tree for coupling a plurality of clock sinks to a clock source in an integrated circuit, the method comprising the computer-implemented steps of:

(A) determining a first distance from each of a set of uncoupled clock sinks to said clock source;

(B) choosing a first of said set of uncoupled clock sinks such that said first distance corresponding to said first clock sink is the largest amongst all of said set of uncoupled clock sinks;

(C) forming a first branch wire of said clock tree between said first clock sink and said clock source and subsequently removing said first clock sink from said set of uncoupled clock sinks;

(D) finding a corresponding minimal balance point on said clock tree for each of said set of uncoupled clock sinks;

(E) determining a second distance from each of said uncoupled clock sinks to its corresponding minimal balance point;

(F) choosing a second of said set of uncoupled clock sinks such that said second distance corresponding to said second clock sink is the largest amongst all of said set of uncoupled clock sinks;

(G) forming a second branch wire of said clock tree between said second clock sink and its corresponding minimal balance point and subsequently removing said second clock sink from said set of uncoupled clock sinks; and (H) repeating steps (D)–(G) until said set of uncoupled clock sinks is empty.

8. The method of claim 7, further comprising the step of:

(I) forming a rectilinear clock tree, comprising a set of horizontal and vertical wires, from said clock tree such that said rectilinear clock tree maintains planarity.

9. The method of claim 8, wherein step (I) further comprises the steps of:

(I1) selecting a first and second of said plurality of clock sinks that are coupled together by a branch wire;

(I2) forming a bounding box for said first and second clock sinks;

(I3) determining whether a baseline exists on said bounding box;

(I4) performing a line search algorithm to construct said set of horizontal and vertical wires coupling said first and second clock sinks, wherein said set of horizontal and vertical wires is within said bounding box, and wherein said set of wires further includes a baseline wire along said baseline, if in step (I3) it is determined that a baseline exists; and (I5) repeating steps (I1)–(I4) until said clock tree is completely rectilinear.

10. The method of claim 9, wherein said line search algorithm comprises a modified Ohtsuki's line search algorithm.

11. The method of claim 8, further comprising the steps of:

(J) deleting a first wire of said set of horizontal and vertical wires of said rectilinear clock tree to create a first clock subtree and second clock subtree;

(K) creating a new branch wire by reconnecting said first clock subtree and said second clock subtree, wherein said new branch wire is a length that will produce a predetermined tolerable clock skew; and (L) repeating steps (J)–(K) for each of said set of horizontal and vertical wires of said rectilinear clock tree.

12. The method of claim 11, wherein said new branch wire formed in step (K) is formed along a shortest path between said first and second clock subtrees, and wherein said shortest path will produce said predetermined tolerable clock skew.

13. A method of automatically creating a clock tree for coupling a plurality of clock sinks to a clock source in an integrated circuit, said method comprising the steps of:

(A) creating a first branch wire of said clock tree between said clock source and a first of a set of uncoupled clock sinks, wherein said first clock sink is selected such that a first distance from said clock source to said first clock sink is the largest amongst all of said set of uncoupled clock sinks;

(B) removing said first clock sink from said set of uncoupled clock sinks;

(C) creating a second branch of said clock tree between a second of said set of uncoupled clock sinks and a corresponding balance point on said first branch, wherein said second clock sink is selected from said set of uncoupled clock sinks according to a maximum rule, and said corresponding balance point is selected amongst a set of possible balance points according to a minimum rule, wherein said maximum rule states that a distance between said second clock sink and said balance point is the largest amongst all uncoupled clock sinks, and wherein said minimum rule states that a distance between said second clock sink and said corresponding balance point is the smallest amongst all of said possible balance points;

(D) removing said second balance point from said set of uncoupled clock sinks; and (E) repeating steps (C) and (D) until said set of uncoupled clock sinks is empty.

14. The method of claim 13, further comprising the step of:

(F) forming a rectilinear clock tree, comprising a set of horizontal and vertical wires, from said clock tree such that said rectilinear clock tree maintains planarity.

15. The method of claim 14, wherein step (F) further comprises the steps of:

(F1) selecting a first and second of said plurality of clock sinks that are coupled together by a branch wire;

(F2) forming a bounding box for said first and second clock sinks;

(F3) determining whether a baseline exists on said bounding box;

(F4) performing a line search algorithm to construct said set of horizontal and vertical wires coupling said first and second clock sinks, wherein said set of horizontal and vertical wires is within said bounding box, and wherein said set of wires further includes a baseline wire along said baseline, if in step (F3) it is determined that a baseline exists; and (F5) repeating steps (F1)–(F4) until said clock tree is completely rectilinear.

16. The method of claim 15, wherein said line search algorithm comprises a modified Ohtsuki's line search algorithm.

17. The method of claim 14, further comprising the steps of:

(G) deleting a first of said set of horizontal and vertical wires of said rectilinear clock tree to create a first clock subtree and second clock subtree;

(H) creating a new branch wire by reconnecting said first clock subtree and said second clock subtree, wherein said new branch wire is a length that will produce a predetermined tolerable clock skew; and (I) repeating steps (G)–(H) for each of said set of horizontal and vertical wires of said rectilinear clock tree.

18. The method of claim 17, wherein said new branch wire formed in step (H) is formed along a shortest path between said first and second clock subtrees, and wherein said shortest path will produce said predetermined tolerable clock skew.

19. A method of automatically creating a clock tree for coupling a plurality of clock sinks to a clock source in an integrated circuit, said method comprising the steps of:

(A) creating a first branch wire of said planar clock tree between said clock source and a first of a set of uncoupled clock sinks, wherein said first clock sink is selected such that a first distance from said clock source to said first clock sink is maximized among all of said plurality of clock sinks, and wherein said first clock sink is subsequently removed from said set of uncoupled clock sinks;

(B) creating a second branch wire of said planar clock tree between a second of said set of uncoupled clock sinks and a corresponding balance point on said first branch, wherein said second clock sink is selected from said set of uncoupled clock sinks according to a maximum rule, and said corresponding balance point is selected from a set of possible balance points according to a minimum rule, wherein said maximum rule states that a distance between said second clock sink and said balance point is the largest amongst all of said uncoupled clock sinks, and wherein said minimum rule states that a distance between said second clock sink and said corresponding balance point is the smallest amongst all of said possible balance points;

(C) removing said second clock sink from said set of uncoupled clock sinks;

(D) creating a cluster comprising a set of said uncoupled clock sinks, wherein said cluster is bounded on a first side by said first branch wire and on a second side by said second branch wire;

(E) creating a third branch of said planar clock tree between a third of said set of uncoupled clock sinks and its corresponding balance point according to said minimum rule and said maximum rule, wherein said minimum rule and said maximum rule are applied only to all of said set of uncoupled clock sinks comprising said cluster; and (F) removing said third clock sink from said set of uncoupled clock sinks.

20. The method of claim 19, further comprising the step of:

(G) repeating steps (D)–(F) until said set of uncoupled clock sinks is empty.

21. The method of claim 19, further comprising the step of:

(G) forming a rectilinear clock tree, comprising a set of horizontal and vertical wires, from said clock tree such that said rectilinear clock tree maintains planarity.

22. The method of claim 21, wherein step (G) further comprises the steps of:

(G1) selecting a first and second of said plurality of clock sinks that are coupled together by a branch wire;

(G2) deleting said branch wire;

(G3) forming a bounding box for said first and second clock sinks;

(G4) determining whether a baseline exists on said bounding box;

(G5) performing a line search algorithm to construct said set of horizontal and vertical wires coupling said first and second clock sinks, wherein said set of horizontal and vertical wires is within said bounding box, and wherein said set of wires further includes a baseline wire along said baseline, if in step (G4) it is determined that a baseline exists; and (G6) repeating steps (G1)–(G5) until said clock tree is completely rectilinear.

23. The method of claim 22, wherein said line search algorithm comprises a modified Ohtsuki's line search algorithm.

24. The method of claim 21, further comprising the steps of:

(H) deleting a first of said set of horizontal and vertical wires of said rectilinear clock tree to create a first clock subtree and second clock subtree;

(I) creating a new branch wire by reconnecting said first clock subtree and said second clock subtree, wherein said new branch wire is a length that will produce a predetermined tolerable clock skew; and (J) repeating steps (H)–(I) for each of said set of horizontal and vertical wires of said rectilinear clock tree.

25. The method of claim 24, wherein said new branch wire formed in step (I) is formed along a shortest path between said first and second clock subtrees, and wherein said shortest path will produce said predetermined tolerable clock skew.

26. A method of creating a rectilinear clock tree in an integrated circuit comprising the steps of:

(A) providing a planar rectilinear clock tree comprising a set of horizontal and vertical wires, (B) deleting a first of said set of horizontal and vertical wires of said rectilinear clock tree to create a first clock subtree and second clock subtree; and (C) creating a new branch wire by reconnecting said first clock subtree and said second clock subtree, wherein said new branch wire is a length that will produce a predetermined tolerable clock skew.

27. The method of claim 26, wherein said new branch wire formed in step (C) is formed along a shortest path between said first and second clock subtrees, and wherein said shortest path will produce said predetermined tolerable clock skew.

28. A method of automatically constructing a planar equal path length signal tree for couplin two signal sinks to a signal source in an integrated circuit, the method comprising the steps of:

(A) forming a first branch wire on said signal tree between said signal source and a first of said two signal sinks, wherein said first signal sink is a farthest distance from said signal source of said two signal sinks; and (B) forming a second branch wire on said signal tree between said second signal sink and a first balance point on said first branch wire.

* * * * *